US006989882B2

(12) United States Patent
Kimura

(10) Patent No.: US 6,989,882 B2
(45) Date of Patent: Jan. 24, 2006

(54) WIRING BOARD, CIRCUIT BOARD, ELECTRO-OPTICAL DEVICE AND METHOD FOR MANUFACTURING THE SAME, AND ELECTRONIC DEVICE

(75) Inventor: Mutsumi Kimura, Kyotanabe (JP)

(73) Assignee: Seiko Epson Corporation, Tokyo (JP)

( * ) Notice: Subject to any disclaimer, the term of this patent is extended or adjusted under 35 U.S.C. 154(b) by 95 days.

(21) Appl. No.: 10/690,534

(22) Filed: Oct. 23, 2003

(65) Prior Publication Data

US 2004/0125551 A1    Jul. 1, 2004

(30) Foreign Application Priority Data

Oct. 24, 2002    (JP)    ............................. 2002-310010

(51) Int. Cl.
*G02F 1/1345*    (2006.01)
*H01L 29/15*    (2006.01)
*H01L 29/04*    (2006.01)
*H01L 31/036*    (2006.01)

(52) U.S. Cl. .......................... 349/152; 349/151; 257/72
(58) Field of Classification Search ................ 349/151, 349/152
See application file for complete search history.

(56) References Cited

U.S. PATENT DOCUMENTS

| | | | | |
|---|---|---|---|---|
| 5,585,666 A | * | 12/1996 | Imamura | ..................... 257/668 |
| 5,761,149 A | * | 6/1998 | Suzuki et al. | .......... 365/230.03 |
| 6,310,667 B1 | * | 10/2001 | Nakayoshi et al. | ........... 349/42 |
| 6,424,092 B1 | * | 7/2002 | Odake et al. | ............ 315/169.3 |
| 6,531,713 B1 | | 3/2003 | Yamazaki | |
| 6,545,731 B2 | * | 4/2003 | Melnik et al. | ................ 349/44 |
| 6,747,322 B2 | * | 6/2004 | Karasawa et al. | .......... 257/390 |
| 2002/0179964 A1 | * | 12/2002 | Kato et al. | ................... 257/316 |
| 2003/0146693 A1 | | 8/2003 | Ishihara et al. | |
| 2004/0080276 A1 | | 4/2004 | Ito | |
| 2005/0083742 A1 | * | 4/2005 | Hwang et al. | .............. 365/200 |

FOREIGN PATENT DOCUMENTS

| | | |
|---|---|---|
| EP | 0 858 110 A1 | 8/1998 |
| EP | 1 063 704 A2 | 12/2000 |
| EP | 1 109 224 A2 | 6/2001 |
| JP | A 2000-340798 | 12/2000 |

OTHER PUBLICATIONS

Tam et al.; " Improved Polysilicon TFT Drivers for Light Emitting Polymer Displays"; IDW; 2000; pp 243-246.
Kimura et al.; "An area-ratio gray-scale method to achieve image uniformity in TFT-LEPDs"; Journal of the SID 8/2; 2000; pp 93-97.
Tam et al.; "Polysilicon TFT Drivers for Light Emitting Polymer Displays"; IDW; 1999; pp 175-178.
Kimura et al.; "Low-Temperature Poly-Si TFT Display using Light-Emitting-Polymer"; AM-LCD; 2000; pp 245-248.

* cited by examiner

*Primary Examiner*—Victor A. Mandala, Jr.
(74) *Attorney, Agent, or Firm*—Oliff & Berridge, PLC

(57) ABSTRACT

The invention reduces the resistance of a feed line in a display device (electro-optical device), and reduces the loss in the current supply to a light-emitting element, etc. In an electro-optical device including an electro-optical element and a driver circuit to drive the electro-optical element, a wiring board used for the electro-optical device includes a feed line film to supply the driver circuit with current to put the electro-optical element into operation; a signal line film to supply the driver circuit with a level signal to determine intensity of the current to be supplied to the electro-optical element; and an operation line film to supply the driver circuit with an operation instruction signal to instruct whether to put the electro-optical element into operation, and the feed line film constitutes an upper layer among the feed line film, the signal line film, and the operation line film.

18 Claims, 11 Drawing Sheets

Sectional view taken along line A-A'

Sectional view taken along line B-B'

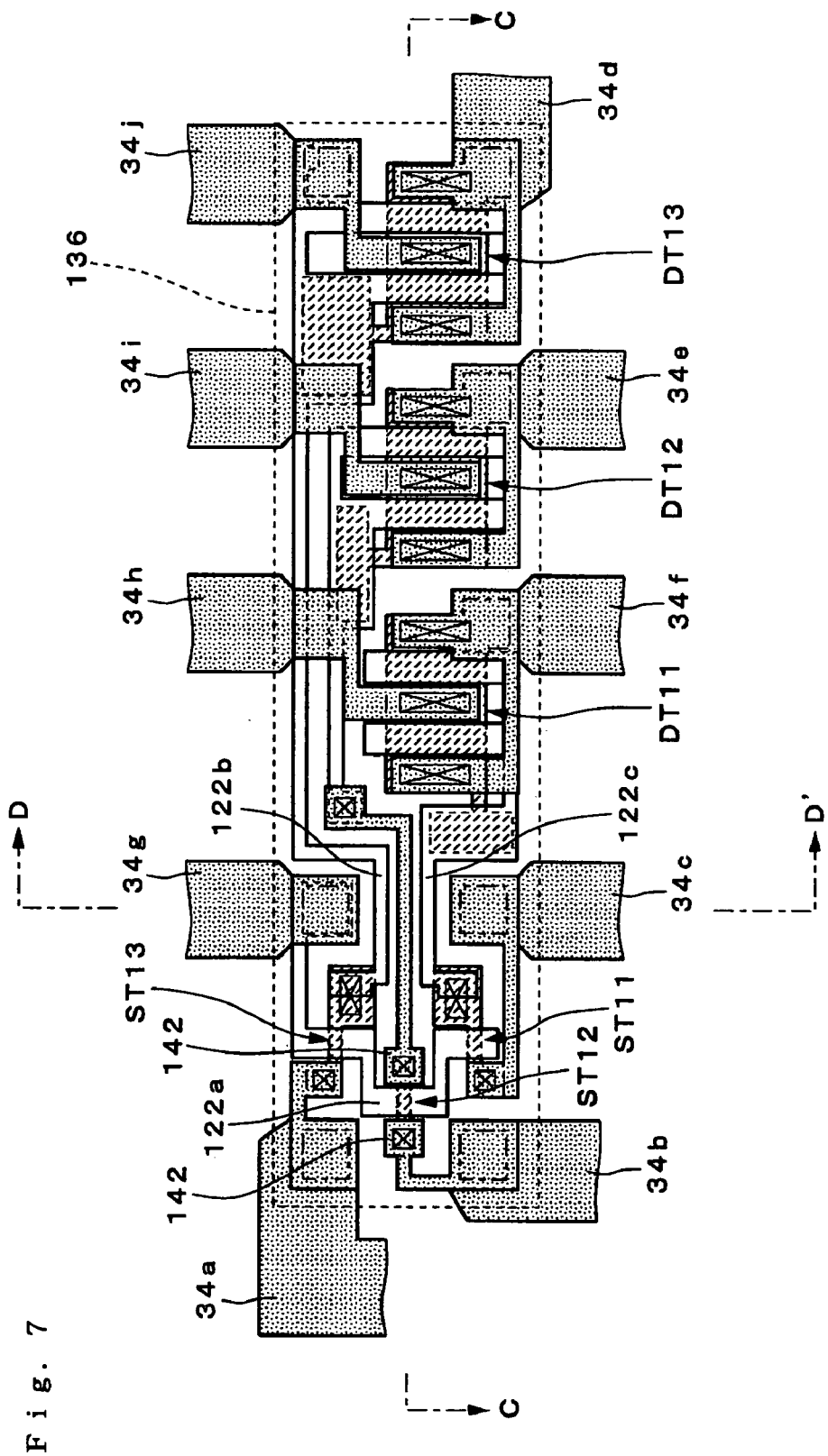

Sectional view taken along line C-C'

Sectional view taken along line D-D'

WIRING BOARD, CIRCUIT BOARD, ELECTRO-OPTICAL DEVICE AND METHOD FOR MANUFACTURING THE SAME, AND ELECTRONIC DEVICE

BACKGROUND OF THE INVENTION

1. Field of Invention

The present invention relates to an enhanced technique of forming a wiring board, an electro-optical device (display device) to which this technique is applied and a method of manufacturing the same.

2. Description of Related Art

The related art includes research, development and commercialization concerning a TFT-driving-mode LED display device, which is one of the self-light-emitting display devices that drive a pixel by a TFT etc. Such a display device is disclosed in, for example, the following documents: "S. W.-B. Tam, M. Kimura, et al., Proc. IDW '99, p. 175", "M. Kimura, et al., J. SID 8, p. 93 (2000)", "M. Kimura, et al., Dig. AM-LCD 2000, p. 245", and "S. W.-B. Tam, M. Kimura, et al., Proc. IDW 2000, p. 243".

FIG. 11 is a schematic of a pixel circuit of a related art TFT-driving-mode light-emitting display device. Scanning lines 311 and signal lines 312 are formed in a matrix. At each intersection of the scanning lines 311 and the signal lines 312, a pixel circuit is formed that includes a switching TFT 313, a driving TFT 314, and a light-emitting element 315. When the scanning line 311 is "on" potential, the switching TFT 313 samples the electrical potential of the signal line 312.

The driving TFT 314 controls quantity of the current supplied by a feed line 316 and flowing into the light-emitting element 315 according to the electrical potential sampled by the switching TFT 313, so as to control the light-emitting condition of the light-emitting element 315.

SUMMARY OF THE INVENTION

In the above-described TFT-driving-mode light-emitting display device, the light-emitting element 315 needs to be supplied with comparatively large current in order to emit light. Consequently, the feed line 316 to supply current to the driving TFT 314 is preferably formed so as to have as low resistance as possible. If the resistance of the feed line 316 is not sufficiently low, the effect of the voltage drop occurring in the feed line 316 becomes big. Consequently the driving voltage cannot be reduced, and the intensity of light-emission of the light-emitting element 315 drops due to a drop in the current supply.

The present invention reduces the resistance of the feed line in the display device, and reduces the loss in the current supply to the light-emitting element, etc.

The present invention reduces the resistance of the feed line in the display device, and to reduce the voltage required to drive the light-emitting element, etc.

To address or attain the above, the present invention is a wiring board used for an electro-optical device including an electro-optical element and a driver circuit to drive the electro-optical element. The wiring board includes a feed line film to supply the driver circuit with current to put the electro-optical element into operation; a signal line film to supply the driver circuit with a level signal to determine intensity of the current to be supplied to the electro-optical element; and an operation line film to supply the driver circuit with an operation instruction signal to instruct whether to put the electro-optical element into operation.

The feed line film constitutes an upper layer among the feed line film, the signal line film, and the operation line film.

Generally, the feed line film preferably has lower resistivity rate so as to inhibit the voltage drop occurring when current flows through the feed line film. It is formed so as to fulfill such request. However, if a feed line film with lower resistance is formed, and if thereafter the signal line film and the operation line film (and other elements) are formed above the feed line film, then the resistance of the feed line film, which formed first, often increases due to the effect (for example, the effect of the high temperature atmosphere) of the manufacturing process forming the signal line film, etc. Therefore, in the present invention, the feed line film constitutes an upper layer among the wiring films included in the wiring board so as to be formed as late as possible. This prevents the feed line film from having higher resistance due to the effect of the manufacturing process as much as possible and thus the feed line film with lower resistance can be obtained. Consequently, the resistance of the feed line film in the electro-optical device (display device) including the wiring board according to the present invention can be reduced, and thereby the loss in the current supply to the electro-optical elements such as light-emitting element and the voltage required to drive the light-emitting element, etc., can be reduced.

The "electro-optical device" in the present invention means the device with the electro-optical element that emits light by the electrical action or changes the condition of outside light and includes both the one that emits light oneself and the one that controls passage of outside light. It means a display with an electro-optical element, such as a liquid crystal element, an electrophoresis element having medium in which electrophoresis particles are dispersed, an electroluminescence (EL) element, an electron emissive element in which light is generated by hitting the light-emitting board with electrons generated when the electric field is impressed.

The feed line film is preferably formed to be thicker than at least one of the signal line film and the operation line film. Generally, if the wiring films such as the feed line film are formed thickly, the wiring films are often deformed by the stress in the following manufacturing process, thereby having adverse effects, such as the occurrence of a warp of the substrate on which the feed line films are formed. However, as described above, in the present invention, the feed line film constitutes an upper layer among the wiring films, and the effects in the following manufacturing process is minimized. As a result, the feed line film can be formed more thickly. This achieves a further reduction in the resistance of the feed line film.

The feed line film is preferably formed of a conductive film having lower resistance than at least one of the signal line film and the operation line film. The possible conductive films with lower resistance are aluminum, gold, silver, copper, platinum, and palladium, etc. By using such conductive films, the resistance of the feed line film is further reduced.

The feed line film and the operation line film are preferably disposed in the same layer. The feed line film and the operation line film are thereby formed in the same process. This simplifies the manufacturing process. Additionally, this also reduces the resistance of the operation line film. The feed line film and the signal line film may also be disposed in the same layer.

The operation line film and the feed line film are preferably formed to extend substantially parallel to each other. This enables effective use of the space for arrangement of the operation line film and the feed line film. Thus, a wider region for forming the feed line film can be secured, and the resistance of the feed line film can be further reduced.

Additionally, the present invention is a wiring board used for an electro-optical device including a display region and a driver circuit, the display region including a plurality of basic pixels, each including at least one electro-optical element, the driver circuit driving each of the electro-optical element. The wiring board includes a plurality of feed line films to supply the driver circuit with current to put the electro-optical element into operation; a plurality of signal line films to supply the driver circuit with a level signal to determine intensity of the current to be supplied to the electro-optical element; and a plurality of operation line films to supply the driver circuit with an operation instruction signal for instructing whether to put the electro-optical element into operation. The feed line films constitute an upper layer among the feed line films, the signal line films, and the operation line films. The plurality of feed line films are disposed along the array of the basic pixels, and at least one feed line film is shared by two adjacent columns of the basic pixels.

By locating the feed line films in an upper layer among the wiring films included in the wiring board, the feed line films are formed as late as possible. This prevents the feed line films from having higher resistance due to the effect of the manufacturing process and thus the feed line films can have lower resistance. The sharing of the feed line films by two basic pixels adjacent to each other enables allocation of a wider region to form each feed line film, and the widened feed line film can have lower resistance. Consequently, the resistance of the feed line films in the electro-optical device including the wiring board according to the present invention is reduced, and thereby the loss in the current supply to the electro-optical elements, such as light-emitting elements and the voltage required to drive the light-emitting elements can be reduced.

Also in the present invention, the feed line films are preferably formed to be thicker than at least ones of the signal line films and the operation line films. The feed line films are also preferably formed of the conductive films with lower resistance than at least ones of the signal line films and the operation line films. The feed line films and the operation line films are preferably disposed in the same layer. The operation line films and the feed line films are preferably formed to extend substantially parallel to each other. Since the advantages in adopting these are as described above, the description of them are omitted here.

When the basic pixels each include three electro-optical elements, the feed line films are preferably disposed so that three of the plurality of feed line films are shared by two adjacent columns of the basic pixels. Such arrangement is suitable for the basic pixel including three electro-optical elements (corresponding to, for example, red, green, and blue) used for color display devices.

Each of the feed line films, the operation line films, and the signal line films are preferably arranged in reflection symmetry along the center line that is the boundary between two adjacent columns of the basic pixels. By such an arrangement, the arrangement of feed line films, which are shared by two adjacent columns of the basic pixels, is made easy.

Furthermore, the present invention is a circuit board used for an electro-optical device including an electro-optical element and a driver circuit to drive the electro-optical element. The circuit board includes a circuit thin film holding the driver circuit; a feed line film to supply the driver circuit with current to put the electro-optical element into operation; a signal line film to supply the driver circuit with a level signal to determine intensity of current to be supplied to the electro-optical element; and an operation line film to supply the driver circuit with an operation instruction signal to instruct whether to put the electro-optical element into operation. The feed line film constitutes an upper layer among the circuit thin film, the feed line film, the signal line film, and the operation line film.

By locating the feed line film in an upper layer among the wiring films and the circuit thin film included in the circuit board, the feed line film can be formed as late as possible. This prevents the feed line film from having higher resistance due to the effect of the manufacturing process and thus the feed line film can have lower resistance. Particularly in the case of the circuit thin film including the semiconductor element, to form a semiconductor thin film holding the semiconductor element requires high temperature process. By forming the feed line film above the circuit thin film that requires such high temperature process, the increase in the resistance of the feed line film can be reduced or inhibited effectively.

In the circuit board when the driver circuit includes a plurality of thin film transistors, one of the signal line film and the operation line film and a gate line of the thin film transistor are preferably disposed in the same layer, and the other of the signal line film and the operation line film, a feed line film and a source/drain line of the thin film transistor are preferably disposed above the layer. By adopting these, the signal line film (or the operation line film) and the gate line can be formed in the same process, thereafter, the operation line film (or the signal line film), the feed line film, and source/drain line can be formed in the same process. This simplifies the manufacturing process. Additionally, since the source/drain line can be formed in the same process as the feed line film, the source/drain line, through which comparatively large current flows, can have lower resistance.

In the present invention, the feed line film is preferably formed to be thicker than at least one of the signal line film, the operation line film, and the circuit thin film. The feed line film is also preferably formed of the conductive film with lower resistance than at least one of the signal line film, the operation line film, and the circuit thin film. The feed line films and the operation line films are preferably disposed in the same layer. The operation line film and the feed line film are preferably formed to extend substantially parallel to each other. Since the advantages in adopting these are as described above, the description of them is omitted here.

The present invention is an electro-optical device including an electro-optical element and a driver circuit formed on the above-described wiring board. The present invention is also an electro-optical device including an electro-optical element formed on the above-described circuit board. Such a structure reduces the resistance of the feed line film in the electro-optical device, thereby reducing the loss in the current supply to the light-emitting element, etc., and the voltage required to drive the light-emitting element, etc.

In the above-described electro-optical device, the driver circuit is preferably a circuit thin film formed on a transferor substrate different from the wiring board, and the driver circuit is preferably separated from the transferor substrate and transferred to be connected electrically with each of the feed line film, the signal line film, and the operation line film of the wiring board. Forming the driver circuit on a substrate different from the wiring board and thereafter transferring the driver circuit to the wiring board enable the reduction of the thermal damage to the feed line film as compared with the case of directly forming the driver circuit on the wiring board with the feed line film. As a result, the increase in the resistance of the feed line film is inhibited.

The present invention is a method for manufacturing an electro-optical device including a display region and a driver circuit, the display region including a plurality of basic pixels, each including at least one electro-optical element, the driver circuit driving each of the electro-optical element. The method includes a substrate wiring forming process forming, a laminated wiring including a feed line film to supply the driver circuit with current to put the electro-optical element into operation, a signal line film to supply the driver circuit with a level signal to determine intensity of the current to be supplied to the electro-optical element, and an operation line film to supply the driver circuit with an operation instruction signal to instruct whether to put the electro-optical element into operation, on a first substrate according to the array of the basic pixels; a circuit thin film forming process transferably forming a circuit thin film holding the driver circuit on a second substrate; and a circuit thin film transfer process transferring the circuit thin film from the second substrate to each region corresponding to the basic pixels on the first substrate, and connecting the circuit thin film with the laminated wiring. The substrate wiring forming process forms the laminated wiring so that the feed line film constitutes an upper layer among the feed line film, the signal line film, and the operation line film.

By such a manufacturing method, the feed line film is formed as late as possible. In this way, increase in resistance of the feed line film due to the effect of manufacturing process is reduced or minimized, and the feed line film with lower resistance is obtained. Additionally, since the driver circuit is formed by transferring a transferable circuit thin film, the thermal damage to the feed line film is reduced as compared with the case of directly forming the driver circuit on the wiring board with the feed line film. As a result, the increase in the resistance of the feed line film is inhibited. These reduce the resistance of the feed line films in the electro-optical device, thereby reducing the loss in the current supply to the light-emitting element etc., and the voltage required for driving the light-emitting element, etc.

The circuit thin film forming process preferably includes forming a delamination layer locating between the second substrate and the circuit thin film and having properties causing a change in state by the application of energy and reducing bonding strength with the circuit thin film. This makes delamination and transfer of the circuit thin film easy.

The present invention is a method for manufacturing an electro-optical device including an electro-optical element and a driver circuit to drive the electro-optical element. The method includes a circuit board forming process forming, on a substrate, a circuit thin film holding the driver circuit, a feed line film to supply the driver circuit with current to put the electro-optical element into operation, a signal line film to supply the driver circuit with a level signal to determine intensity of the current to be supplied to the electro-optical element, and an operation line film to supply the driver circuit with an operation instruction signal to instruct whether to put the electro-optical element into operation and an electro-optical element forming process forming the electro-optical element on the substrate on which the circuit thin film, the feed line film, the signal line film, and the operation line film are formed. The circuit board forming process forms each film so that the feed line film constitutes an upper layer among the circuit thin film, the feed line film, the signal line film, and the operation line film.

By such a manufacturing method, the feed line film is formed as late as possible. In this way, increase in resistance of the feed line film due to the effect of manufacturing process can be reduced or minimized, and the feed line film with lower resistance can be obtained. Even if the circuit thin film includes semiconductor elements (for example, TFT) and needs a comparatively high temperature process, since the feed line film is formed after forming of the circuit thin film, the feed line film is prevented from being affected by the high temperature process, and the feed line film with lower resistance can be obtained.

When the driver circuit includes a thin film transistor, the circuit board forming process preferably disposes one of the signal line film and the operation line film and a gate line of the thin film transistor in the same layer, and preferably disposes the other of the signal line film and the operation line film, a feed line film, and a source/drain line of the thin film transistor above the layer. This simplifies the manufacturing process. Additionally, since the source/drain line is formed in the same process as the feed line film, the source/drain line, through which comparatively large current flows, can have lower resistance.

The present invention is an electronic device in which the above-described electro-optical device according to the present invention is used as a display. The electronic devices include a camcorder, a cellular phone, a personal computer, a personal digital assistant (PDA), etc., for example. The use of the electro-optical device according to the present invention achieves a display of high quality, thereby achieving an electronic device of high quality.

BRIEF DESCRIPTION OF THE DRAWINGS

FIG. 7 is a schematic of an organic EL display device of a second exemplary embodiment;

DETAILED DESCRIPTION OF PREFERRED EMBODIMENTS

A TFT-driving-mode display device of an exemplary embodiment of the present invention is described below. In the following description, as an exemplary embodiment of the TFT-driving-mode display device, an organic EL display device is described.

<First Exemplary Embodiment>

Figure 1:
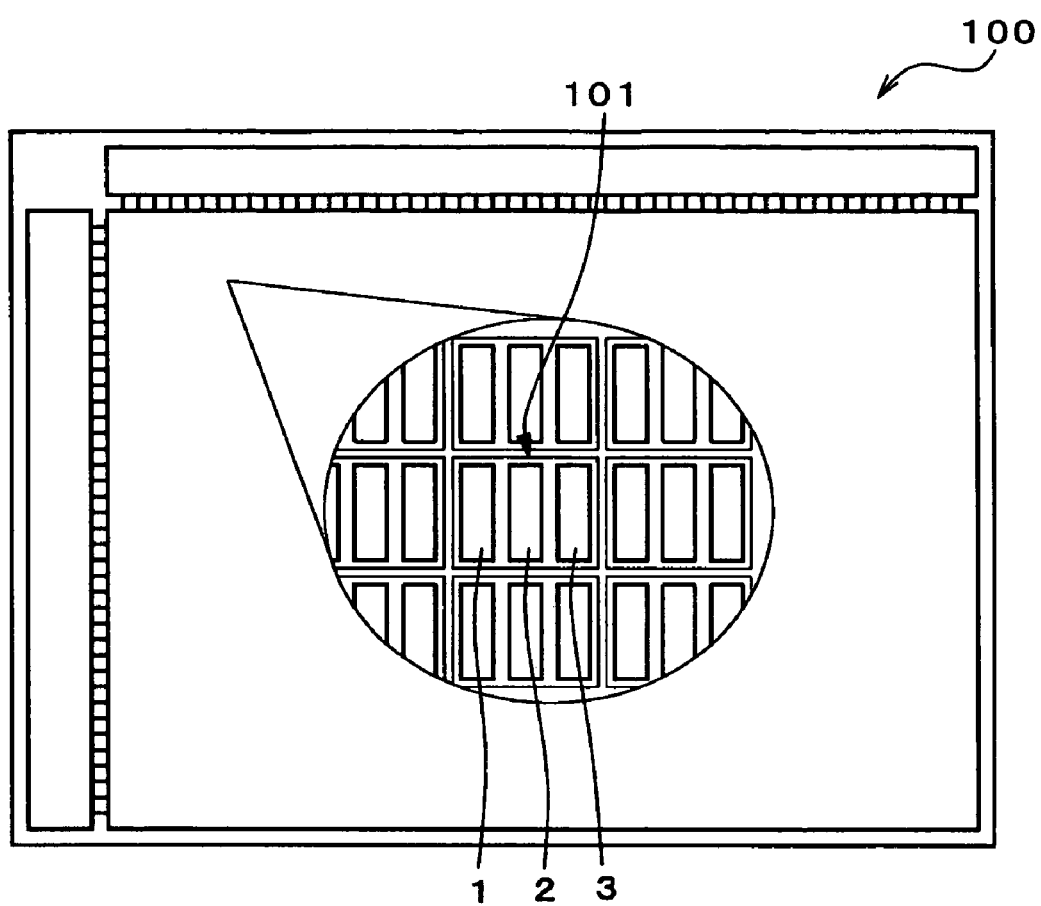
FIG. 1 is a schematic showing the composition of an organic EL display device of the first exemplary embodiment.

FIG. 1 is a schematic showing the structure of an organic EL display device of the first exemplary embodiment. The organic EL display device 100 shown in FIG. 1 includes a display region in which many pixels (basic pixels) 101 are arranged in a matrix. Each basic pixel 101 includes three color pixels 1, 2, and 3. For example, a first color pixel 1, a second color pixel 2, and a third color pixel 3 correspond to red, green, and blue, respectively. Each pixel is driven by a circuit chip (circuit thin film) containing a drive circuit that includes a plurality of thin film transistors (TFT).

Figure 2:
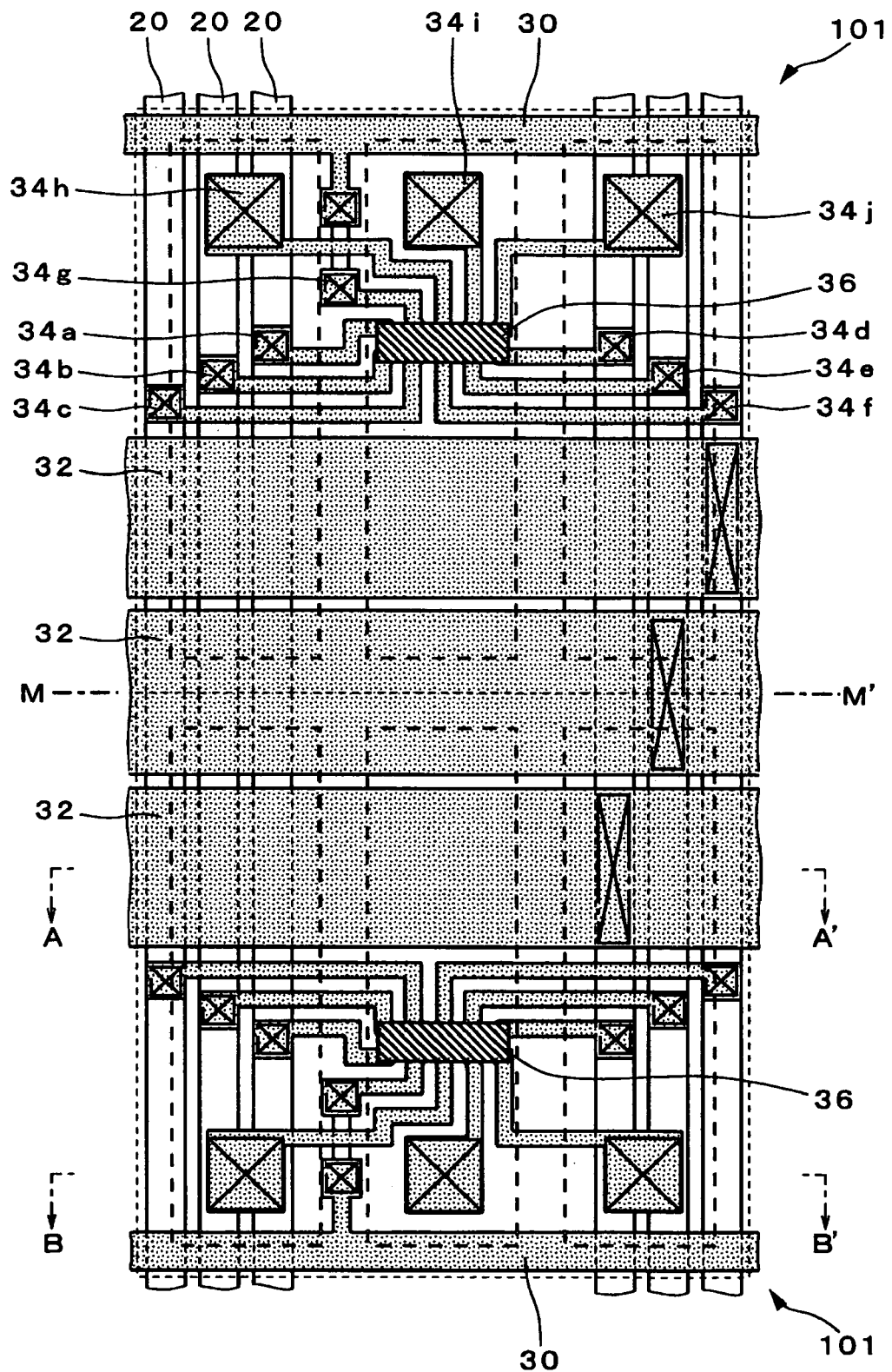
FIG. 2 is a schematic of the structure of pixels.
Figure 3A:
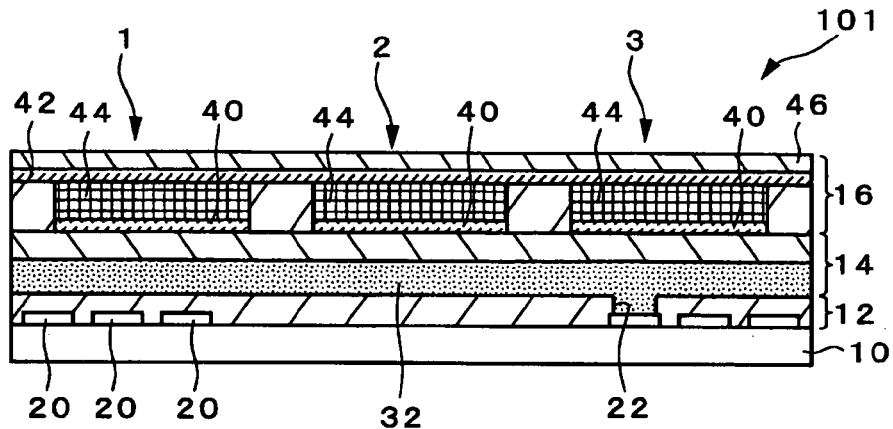
FIGS. 3A and 3B are schematics of the structure of pixels.
Figure 3B:
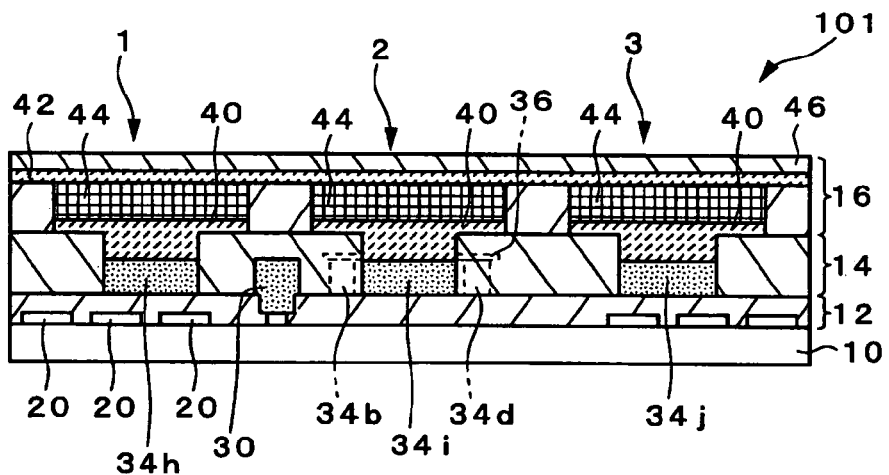

FIG. 2 and FIGS. 3A and 3B are schematics of the structure of the pixel 101. FIG. 2 is a plan view of two adjacent pixels 101. FIGS. 3A and 3B are sectional views taken along plane A–A' and plane B–B' of FIG. 2, respectively. In FIG. 2, some structural elements are omitted for illustrative convenience.

As shown in FIG. 2 and FIGS. 3A and 3B, the organic EL display device of the present exemplary embodiment is formed by laminating a first wiring layer 12, a second wiring layer 14, and a light-emitting element layer 16 (in that order from the bottom) on the substrate 10 made of an insulating material, such as glass; the two vertically-adjacent pixels 101 are arranged symmetrically. A laminated wiring is composed of the first wiring layer 12 and the second wiring layer 14. In FIG. 2, a part of the second wiring layer 14 and the light-emitting element layer 16 are omitted in order to illustrate the structure of the first wiring layer and the second wiring layer.

The first wiring layer 12 includes three signal line films 20 formed on the substrate 10, and an opening 22 formed to connect electrically the signal line films 20 with a wiring film (as hereinafter described) included in the second wiring layer 14. Each signal line film 20 supplies the circuit chip 36 with a level signal, which determines intensity of the current to be supplied to an organic EL element (as hereinafter described in detail) as an electro-optical element included in the light-emitting element layer 16. Through the above-mentioned opening 22, the wiring film included in the second wiring layer 14 is partly in contact with the signal line film 20 for electrical connection therebetween. An insulation material, such as silicon oxide, is provided between each signal line film 20. The insulation material is not shown in FIG. 2.

The second wiring layer 14 includes two operation line films (scanning line films) 30, three feed line films 32, other wiring films 34a to 34j, and a circuit chip 36 to drive the light-emitting element layer 16. Each operation line film 30 supplies the circuit chip 36 with operation instruction signal (scanning signal) which instructs whether to put the organic EL element into operation. Each feed line film 32 supplies the circuit chip 36 with current for operating/driving the organic EL element.

As shown in FIGS. 3A and 3B, in the laminated wiring of the organic EL display device of the present exemplary embodiment, the feed line film 32 is disposed above the signal line film 20 and the operation line films 30. This reduces or minimizes the effect of the manufacturing process after forming the feed line film 32 so as to prevent the feed line film 32 from having higher resistance, and thus the feed line film 32 with lower resistance is obtained. Specifically, in the present exemplary embodiment, after forming the second wiring layer 14 including the feed line film 32, the light-emitting element layer 16 including an organic EL element is formed above the second wiring layer 14. Since the manufacturing process of an organic EL element is generally a low temperature process, the feed line film 32 is not exposed to high temperature.

As shown, the feed line film 32 is thicker than the signal line film 20 in the lower layer, and thus has lower resistance. Additionally, in the present exemplary embodiment, the operation line film 30 is disposed in the same layer where the feed line film 32 is formed. This simplifies the manufacturing process and the operation line film 30 also has lower resistance. The feed line film 32 and the operation line film 30 are formed of a conductive film with lower resistance than the signal line film 20. Specifically, they are formed of a conductive film, such as aluminum, gold, silver, copper, platinum, and palladium.

As shown in FIG. 2, the feed line film 32 and the operation line film 30 extend substantially parallel to each other. This enables effective use of the space for arrangement. Thus, a wider region for forming the feed line film 32 can be secured, and the resistance of the feed line film 32 is reduced. The three feed line films 32 are shared by the two vertically-adjacent pixels 101. This enables allocation of a wider region for forming each feed line film 32, and the widened feed line film 32 has lower resistance.

As shown in FIG. 2, the elements (signal line film 20, operation line film 30, feed line film 32, etc.) of each pixel 101 is formed in substantially reflection symmetry along the center line M–M', which is the boundary between the two vertically-adjacent columns of the pixels 101. In the region to form the two adjacent pixels 101, the operation line films 30, which are disposed in the same layer where the feed line films 32 are formed, are disposed in the vicinity of the upper end and in the vicinity of the lower end, so as to make a wide space in the middle of the region for disposing the three feed line films 32. Thus, the feed line films 32 can be formed in the wide space with flexibility of design arrangement.

The above described circuit chip 36 includes a drive circuit to drive each of the three organic EL elements included each pixel 101. The circuit chip 36 is connected electrically with each of the wiring films 34a to 34j through pad electrodes (not shown). An insulation material (not shown in FIG. 2), such as silicon oxide, is provided between the operation line films, the feed line films, and the like.

The circuit chip 36 of the present exemplary embodiment includes a plurality of TFTs and individually controls the color pixels 1, 2, and 3 included in one pixel 101. The circuit chip 36 includes, for example, three sets of unit circuits, each being a combination of a switching TFT and a driving TFT. An exemplary embodiment of internal structure of the circuit chip 36 is hereinafter described. The circuit chip 36 is transferably formed on a different substrate (transferor substrate) from the substrate 10, then is separated from the transferor substrate so as to be transferred to the substrate 10. The transferring method is hereinafter described in detail.

The light-emitting element layer 16 includes three pixel electrodes 40 formed on the second wiring layer 14, a common electrode 42 disposed opposite to the pixel electrodes 40, three light-emitting layers 44 disposed between each pixel electrode 40 and the common electrode 42, and a protective layer 46 formed on the common electrode 42. An insulation material such as silicon oxide is provided between the pixel electrodes 40, the light-emitting layers 44, and the like. Three organic EL elements (electro-optical element) are composed of each pixel electrode 40, each light-emitting layer 44 laminated thereon, and the common electrode 42. Each organic EL element corresponds to the color pixel 1, 2, or 3. The above-described circuit chip 36 supplies independently current to the light-emitting layers 44 through the respective pixel electrode 40 so as to switch the color pixels 1, 2, and 3 independently.

The internal structure of the circuit chip 36 of the present exemplary embodiment is described below. The internal structure of the circuit chip 36 is not limited to this exemplary embodiment.

Figure 4:
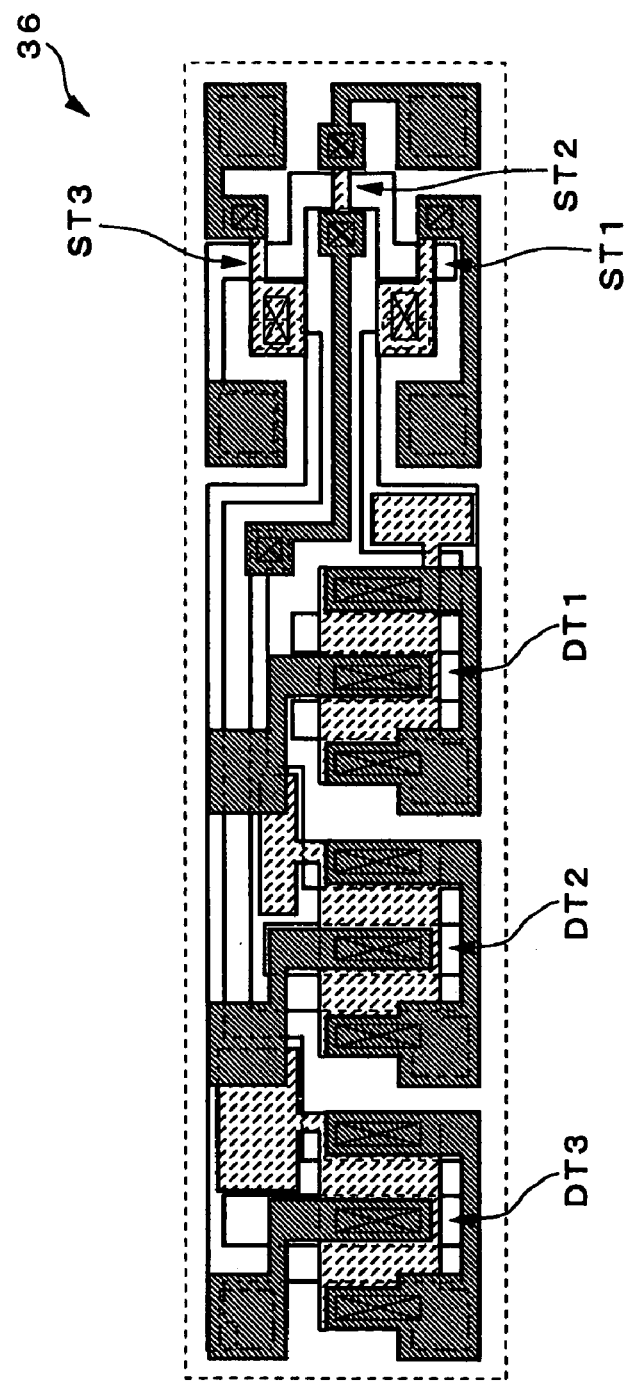
FIG. 4 is a plan view showing an example of the internal structure of a circuit chip.

FIG. 4 is a plan view showing the internal structure of the circuit chip 36. In FIG. 4, the elements, such as TFT (thin film transistor) and wiring included in the circuit chip 36, are shown. As shown in FIG. 4, the circuit chip 36 includes three switching TFTs ST1, ST2, and ST3 arranged vertically in the right region; and three driving TFTs DT1, DT2, and DT3 arranged horizontally in the left region. The circuit chip 36 shown in the drawing has a structure to be transferred to the upper pixel 101 shown in FIG. 2. This circuit chip 36 is turned over to be transferred to a predetermined position in the pixel 101. On the other hand, the circuit chip 36 to be transferred to the lower pixel 101 has a structure which corresponds to the inverted structure of the circuit chip shown in the drawing.

In the present exemplary embodiment, a color pixel is driven by a pixel circuit including of a switching TFT and a driving TFT. Particularly, the switching TFT ST1 shown in FIG. 4 drives the driving TFT DT1 according to the input signal (scanning signal). The driving TFT DT1 controls current flowing to a light-emitting layer 44 constituting the color pixel 1. Similarly, a pixel circuit including a switching TFT ST2 and a driving TFT DT2 controls current flowing to a light-emitting layer 44 constituting the color pixel 2. A pixel circuit including a switching TFT ST3 and a driving TFT DT3 controls current flowing to a light-emitting layer 44 constituting the color pixel 3.

The organic EL display device of the present exemplary embodiment has the above-described composition. A method for manufacturing the device is described below. The following transfer technique is used in the present exemplary embodiment. First, many circuit chips 36, which are described above, are formed on the transferor substrate. Then, the circuit chips 36 are delaminated from the transferor substrate (the first substrate) and are transferred onto the substrate (the second substrate) constituting the organic EL display device.

FIGS. 5A–6C are schematics of a manufacturing method of the exemplary embodiment.

(Substrate Wiring Forming Process)

On the substrate 10, a laminated wiring that includes the signal line film 20, the operation line film 30, and the feed line film 32, is formed according to the arrangement of the pixels 101 (See FIGS. 2–3B). Thus, the wiring board according to the present invention is formed. Since various related art and known methods can be adopted to form the laminated wiring, description of a specific method of forming the laminated wiring is omitted here. At this time, as above-described, the laminated wiring is formed so that the feed line film 32 constitutes an upper layer among the wiring films.

For descriptive convenience, the wiring board including a substrate 10 and laminated wiring formed thereon, is hereinafter referred to as "the transferee substrate". The circuit chip 36 is transferred onto the transferee substrate 66 in a process that is hereinafter described, and the circuit chip 36 is connected electrically with the laminated wiring.

(Circuit Thin Film Forming Process)

Next, many circuit chips 36 that can be transferred are formed on a transferor substrate 60 that is a substrate different from the above-described substrate 10.

Figure 5A:
FIGS. 5A to 5E are schematics of a manufacturing method of an exemplary embodiment.

Particularly, first, as shown in FIG. 5A, a delamination layer (light-absorbing layer) 62 is formed on the transferor substrate 60. The delamination layer has properties causing a change in state by the application of energy and reducing bonding strength with the circuit chip 36. The transferor substrate 60 is preferably light-transmittable. This enables irradiation of the delamination layer with light through the transferor substrate 60 so as to delaminate the delamination layer rapidly and precisely during the irradiation. In this case, the light transmittance is preferably 10 percent or more, and more preferably 50 percent or more. Because the higher the transmittance is, the smaller the attenuation (loss) of light is, and thus the smaller quantity of light is required to delaminate the delamination layer 62.

Also the transferor substrate 60 is preferably made of a material having high reliability, particularly a material having high heat resistance. The reason for this is that, for example, when circuit chips 36 as the subject of the transfer are formed, the process temperature can be high (for example, about 350° C. to 1000° C.) according to their type and the method for forming them. Even in this case, the transferor substrate 60 having high heat resistance expands the ranges of the film forming conditions, such as temperature, etc., upon forming the circuit chips 36 onto the transferor substrate 60. This enables a desired high temperature process when many circuit chips are formed on the transferor substrate. Thus, elements and circuits having high reliability and high performance can be manufactured.

Therefore, if the highest temperature to form the circuit chips 36 is Tmax, the transferor substrate 60 is preferably made of a material having a strain point higher than Tmax. Specifically, the material to form the transferor substrate 60 preferably has a strain point of 350° C. or higher, more preferably 500° C. or higher. Examples of such materials include heat resistant glass, such as quartz glass, Corning 7059, Nippon Electric Glass OA-2, and the like.

Although the thickness of the transferor substrate 60 is not limited, the thickness is preferably about 0.1 to 5.0 mm, more preferably about 0.5 to 1.5 mm. The strength of the transferor substrate 60 increases with its thickness. On the other hand, the thinner the transferor substrate 60 is, the smaller attenuation of light occurs when the transferor substrate 60 has low transmittance. When the transferor substrate 60 has high transmittance, the thickness thereof may exceed the upper limit. In order to permit uniform irradiation with light, the transferor substrate 60 preferably has a uniform thickness.

Although the transferor substrate has many requirements to fulfill as mentioned above, the transferor substrate can be used repeatedly, different from the transferee substrate as a final product. Therefore, even if the transferor substrate is made of a comparatively expensive material, the production cost can be reduced by repeated use.

The delamination layer 62 absorbs light to cause delamination in the layer and/or delamination in the interface (hereinafter referred to as "intralayer delamination" and "interfacial delamination", respectively), and preferably, the intralayer delamination and/or interfacial delamination results from omission or reduction of the interatomic or intermolecular bonding force by irradiation with light, namely ablation, in the material that constitutes the delamination layer 62.

Further, in some cases, gas is discharged from the delamination layer 62 by irradiation with light to cause a separating effect. Namely, the components contained in the delamination layer 62 are discharged as gas, or the delamination layer 62 absorbs light to become gas instantaneously and the vapor is discharged to contribute to separation. Examples of the composition of the delamination layer 62 include the following A to F.

(A) Amorphous silicon (a-Si). Amorphous silicon may contain hydrogen (H). In this case, the H content is preferably about 2 atomic percent or more, more preferably about 2 to 20 atomic percent.

(B) Various oxide ceramics, such as silicon oxide and silicates, titanium oxide and titanates, zirconium oxide and zirconates, and lanthanum oxide and lanthanates, dielectric materials (ferroelectric materials) or semiconductors.

(C) Ceramics such as PZT, PLZT, PLLZT, and PBZT, and dielectric materials (ferroelectric materials)

(D) Nitride ceramics, such as silicon nitride, aluminum nitride, and titanium nitride (E) Organic polymer materials. As an organic polymer materials, any material having bonds such as —CH—, —CO— (ketone), —CONH— (amido), —NH— (imido), —COO— (ester), —N=N— (azo), and —CH=N— (Schiff) (these bonds are severed by light irradiation), particularly any material having many bonds of such a type can be used. The organic polymer material may have an aromatic hydrocarbon group (at least one benzene ring or condensed ring) in the composition thereof. Examples of such organic polymer materials include polyolefins, such as polyethylene and polypropylene, polyimide, polyamide, polyester, polymethylmethacrylate (PMMA), polyphenylenesulfide (PPS), polyethersulfone (PES), and epoxy resins.

(F) Metals. Examples of metals include Al, Li, Ti, Mn, In, Sn, Y, La, Ce, Nd, Pr, Gd, Sm, and alloys containing at least one of these metals. Additionally, the delamination layer may be formed of a hydrogen-containing alloy. In the case where a hydrogen-containing alloy is used for the delamination layer, hydrogen is discharged by light irradiation to facilitate the delamination in the delamination layer. Moreover, the delamination layer may be formed of a nitrogen-containing alloy. In the case where a nitrogen-containing alloy is used for the delamination layer, nitrogen is discharged by light irradiation to facilitate the delamination in the delamination layer. Furthermore, the delamination layer may be formed of a multilayer film. The multilayer film may be composed of, for example, an amorphous silicon film and a metal film formed thereon. The multilayer film may be composed of at least one of the above-mentioned ceramics, metals, and organic polymer materials.

The method for forming the delamination layer 62 is not limited, and is appropriately selected according to conditions, such as the film composition, the film thickness, and the like. Examples of the forming methods include various vapor phase deposition methods, such as CVD, sputtering, etc.; various plating methods; coating methods, such as spin coating etc.; various printing methods; a transfer method; an ink jet coating method; a powder jet method; etc. The delamination layer may be formed by a combination of at least two of these methods.

Additionally, depending on the properties of the transferor substrate 60 and the delamination layer 62, an intermediate layer (not shown in FIG. 5A) may be provided between the transferor substrate 60 and the delamination layer 62, for the purpose of enhancement in adhesiveness thereof. The intermediate layer exhibits at least one of the functions as, for example, a protective layer to physically or chemically protect the transferred layer when the transferred layer is formed or used, an insulating layer, a barrier layer to prevent migration of components to/from the transferred layer, and a reflective layer.

Figure 5B:
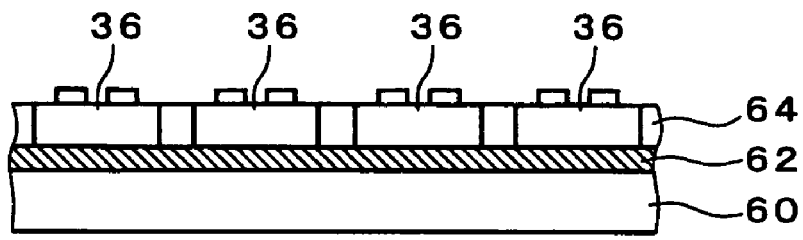

Next, as shown in FIG. 5B, circuit chips 36 are formed on the delamination layer 62. The layer composed of a plurality of circuit chips 36 is referred to as a transferred layer 64. Manufacturing of TFTs needs comparatively high temperature process, and base materials to form TFTs need to fulfill various requirements, as well as the transferor substrate. The manufacturing method of the present exemplary embodiment forms the TFTs on the transferor substrate 60 that fulfills various manufacturing requirements, and then transfers the TFTs onto the final substrate that does not fulfill the manufacturing requirements. Namely, since the manufacturing method of the present exemplary embodiment enables the use of the substrates that are formed of less expensive material, as the end substrate, the manufacturing cost can be reduced. Additionally, since the method enables the use of flexible substrate, the range of choice of materials as the end substrate can be widened.

Particularly, by the above-described transfer method, the present exemplary embodiment does not require formation of a driving circuit directly on the substrate 10 provided with the laminated wiring, and can transfer the circuit chip that is separately formed in the substrate. Thus, the feed line film 32 that is included in the laminated wiring can be prevented from being exposed to high temperature.

Separation of each circuit chip 36 in the transferred layer 64 is described below. Possible methods for separation of each circuit chip 36 are: a method separating each circuit chip 36 by etching, etc., a method providing no structure for separation, a method separating only delamination layer, and a method making a predetermined structure in the transferor substrate so that individual objects to be transferred are readily separated. A method for separating each circuit chip 36 completely is described below.

Figure 5C:
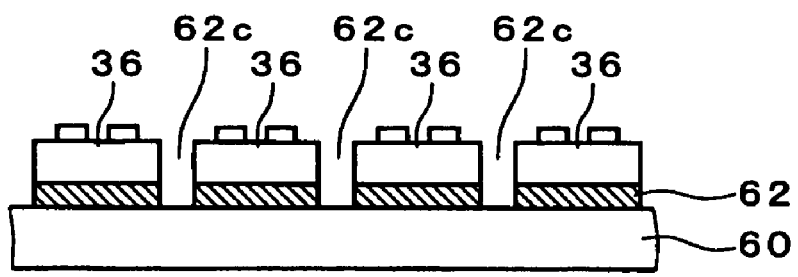
Figure 5D:
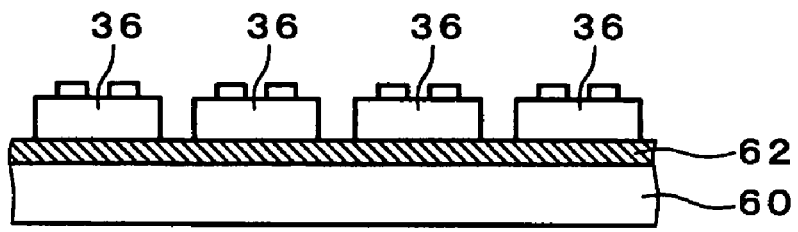

As shown in FIG. 5C, in order to separate each circuit chip 36 individually, grooves 62c are formed around the circuit chip 36 by wet etching or dry etching to leave each circuit chip 36 like an island. Across the thickness of the substrate, these grooves 62c removes all of the transferred layer 64 and all of the delamination layer 62 (see FIG. 5C), or all of the transferred layer 64 and part of the delamination layer 62 (see FIG. 5D). These grooves 62c may be shallower than ones that are formed in the transferred layer 64 only. These grooves 62c may be formed by removing the delamination layer 62 partly as shown in FIG. 5D, or by removing the delamination layer 62 completely as shown in FIG. 5C so as to leave each circuit chip 36 and the delamination layer 62 located directly below it in the same shape like an island. By forming many circuit chips 36 and forming equally-spaced grooves by etching, and thereby arranging these circuit chips 36 on the transferor substrate 60, only a desired circuit chip 36 can be easily transferred in a process that is hereinafter described.

By forming grooves in the delamination layer 62 in advance, it becomes possible to separate a part of the delamination layer neatly along the shape of the region to be separated, and it becomes possible to prevent the region from being broken in the separation. Additionally, a break occurred in the delamination layer 62 in the separation can be prevented from extending to the adjacent region. Forming grooves across the film thickness can separate a particular circuit chip 36 even if the bonding force of the adhesive layer for bonding the circuit chip 36 to the transferee substrate 66 is weak. Furthermore, since the shape of the region to be transferred is clear, alignment between the substrates in the transfer is easy.

Figure 5E:
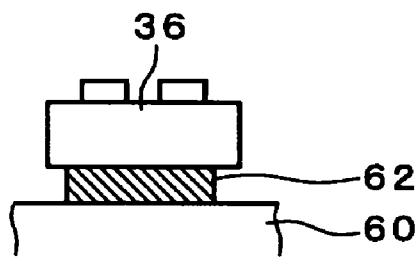

As shown in FIG. 5E, overetching may be performed so that the area of the delamination layer 62 bonding to the circuit chip 36 is smaller than the entire area of the circuit chip 36. Since the area of the delamination layer 62 decreases by overetching as described above, the delamination layer 62 can be surely separated by less force by irradiation of light. By reducing the delamination layer 62, light energy necessary for delamination can be reduced.

Additionally, as shown in FIG. 5D, the delamination layer 62 may be left unetched, whereas the transferred layer 64 is etched so as to form grooves 62c. If energy can be applied evenly to the region where the circuit chip 36 is formed, the delamination can be surely produced in the delamination layer 62 corresponding to the region. Therefore, even if the grooves are not formed in the delamination layer 62 itself, only the desired circuit chip 36 can be separated.

(Circuit Thin Film Transfer Process)

Figure 6A:
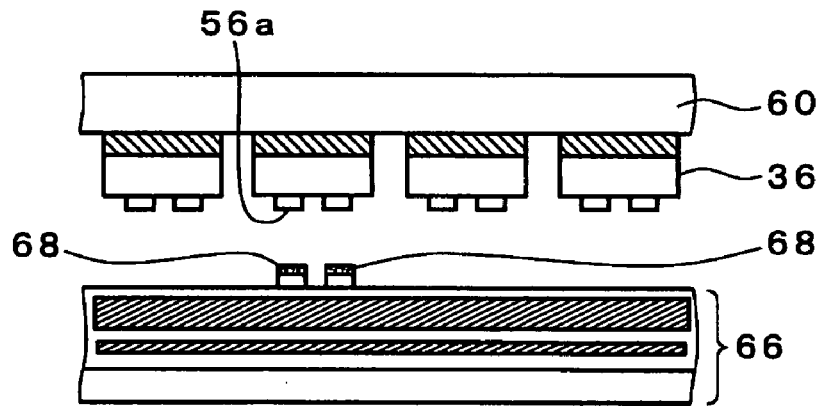
FIGS. 6A to 6C are schematics of a manufacturing method of the exemplary embodiment.

Next, each circuit chip 36 is transferred from the transferor substrate 60 to each region corresponding to the pixel 101 on the transferee substrate 66, and thus the circuit chip is connected with the laminated wiring. Particularly, as shown in FIG. 6A, the surface of the transferor substrate 60 on which the circuit chip 36 is formed and the surface of the transferee substrate 66 onto which the circuit chip 36 is transferred are aligned to come into contact with each other, and pushing force is applied if necessary. Thus, only the circuit chip 36 to be transferred is selectively bonded to the transferee substrate 66 via an adhesive layer 68 that has conducting properties.

Preferable examples of adhesives which constitute the above-mentioned adhesive layer 68 include various curing adhesives, such as reactive curing adhesives, heat curing adhesives, light curing adhesives such as ultraviolet curing adhesives, and anaerobic curing adhesives. As the composition of the adhesive, any type such as an epoxy type, an acrylate type, or a silicone type, may be used. When a ready-made adhesive is used, the adhesive may be diluted by adding appropriate solvent to have a suitable viscosity for application.

In this exemplary embodiment, the adhesive layer 68 is formed only on the circuit chip 36 to be transferred or only on the transferee substrate 66 corresponding to the circuit chip 36 to be transferred. Such local formation of the adhesive layer 68 is performed by various printing method or liquid ejection method. The liquid ejection method includes piezo jet method which ejects liquid by deformation of a piezoelectric element, a method which ejects liquid by generation of bubbles generated by heat, etc. In the present exemplary embodiment, the formation of the adhesive layer 68 is illustrated by an ink jet coating (liquid ejection) method. The adhesive layer 68 is also preferably formed of an anisotropic conductive film including conductive particles.

Figure 6B:
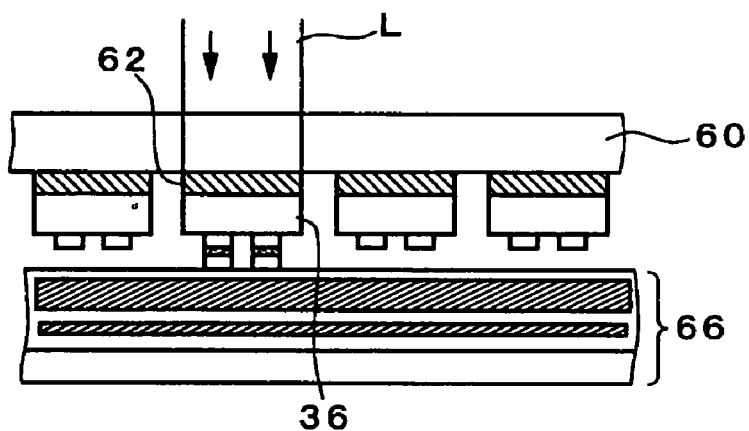

Next, as shown in FIG. 6B, light L is radiated to the assembly of the transferor substrate 60 and the transferee substrate 66 from the side of the transferor substrate 60. At this time, only the delamination layer 62 that holds the circuit chip 36 to be transferred is selectively irradiated. Thus delamination (intralayer delamination and/or interfacial delamination) occurs only in the delamination layer 62 that holds the circuit chip 36 to be transferred.

The intralayer delamination and/or interfacial delamination in the delamination layer 62 is based on ablation occurring in the constituent material of the delamination layer 62, discharge of gas contained in the delamination layer 62, and a phase change such as melting or vaporization occurring immediately after irradiation. The ablation means that a solid material (the constituent material of the delami- nation layer 62) which absorbed light is photochemically or thermally excited and thus atoms or molecules at the surface and the inside of the material are released by decomposition. This mainly is a phenomenon called a phase change such as melting, vaporization (evaporation), etc., occurring in the entire or partial constituent material of the delamination layer 62. Also, in some cases, the phase change causes a fine foam state, and decreases the bonding force.

The type of the delamination produced in the delamination layer 62, i.e., intralayer delamination, interfacial delamination or both types of delamination, depends on the composition of the delamination layer 62, and other various factors. One of the factors is the type, wavelength, intensity, penetrating depth, etc. of radiating light. As the radiating light L, any light can be used as long as it generates intralayer delamination and/or interfacial delamination in the delamination layer 62. Examples of the irradiating light include X-rays, ultraviolet rays, visible light, infrared rays, and laser light.

Laser light is the most preferable among them because it easily produces delamination (ablation) in the delamination layer 62 and it enables local irradiation with high precision. The laser light is preferably a laser light having a wavelength of 100 to 350 nm. Use of the short wavelength laser light improves the precision of light irradiation and facilitates the delamination in the delamination layer 62. As a laser device that generates such laser light, an excimer laser device is preferable. Since the excimer laser outputs high energy in a short wavelength region, it can generate ablation in the delamination layer 62 within a very short time, and thus it can delaminate the delamination layer 62 substantially without temperature rise of the transferee substrate 66 and the transferor substrate 60 adjacent to the delamination layer 62, and without deterioration and damage of the circuit chip 36, etc.

When a phase change, such as gas discharge, evaporation and sublimation occurs in the delamination layer 62 to provide separation properties, the wavelength of the radiating laser light is preferably about 350 to 1200 nm. Laser light irradiation with such a wavelength can be performed by a laser source and irradiation equipment for YAG, gas laser, etc., which are widely used in the field of general manufacturing, and thus it can be performed inexpensively and easily. When laser light with a wavelength in the visible light range is used, the transferor substrate 60 is required merely to transmit visible light, and thus the flexibility of choice of the transferor substrate 60 is enhanced.

The energy density of the radiating laser light, particularly the energy density of excimer laser, is preferably about 10 to 5000 $mJ/cm^2$, more preferably about 100 to 500 $mJ/cm^2$. The irradiation time is preferably about 1 to 1000 nsec, more preferably about 10 to 100 nsec. The higher the energy density is, or the longer the irradiation time is, the more easily ablation occurs. On the other hand, the lower the energy density is, or the shorter the irradiation time is, the lower the risk is that the radiating light transmitted through the delamination layer 62 may adversely affect the circuit chip 36.

Figure 6C:
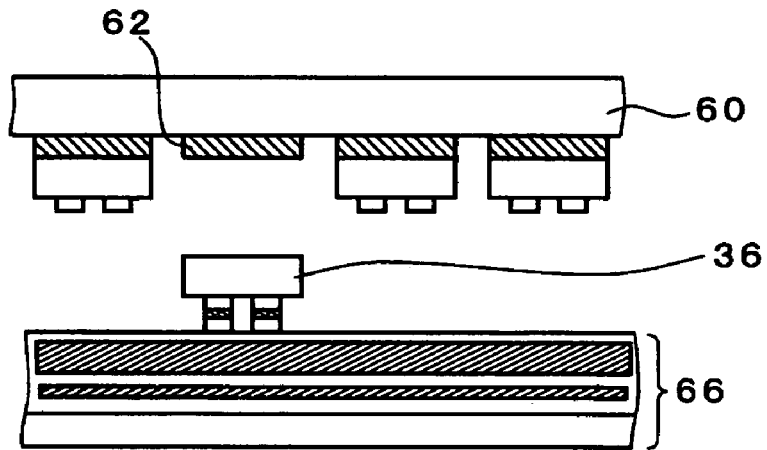

Next, as shown in FIG. 6C, the transferor substrate 60 is separated from the transferee substrate 66 by applying force to the transferor substrate 60 and the transferee substrate 66. Since the delamination layer 62 on the circuit chip 36 to be transferred to the transferee substrate 66 is delaminated in the above-described process, the circuit chip 36 to be transferred is no longer bonded to the transferor substrate 60. The circuit chip 36 to be transferred is bonded to the transferee substrate 66 by the adhesive layer 68.

In the above-described process, the delamination layer 62 is preferably delaminated completely. However, it may be partially delaminated if the adhesive strength between the circuit chip 36 and the adhesive layer 68 exceeds the bonding force between the circuit chip 36 and the undelaminated part of the delamination layer 62 and if consequently the circuit chip 36 to be transferred is surely transferred to the transferee substrate 66 when the transferor substrate 60 and the transferee substrate 66 is separated.

As described above, success or failure of the transfer depends on the relative dynamics between the bonding force of the delamination layer weakened by delamination and the bonding force of the adhesive layer to an object to be transferred. If the delamination of the delamination layer is sufficient, the transfer is possible despite the weakness of bonding force of the adhesive layer. On the other hand, if the bonding force of the adhesive layer is strong, the transfer is possible despite the insufficiency of the delamination of the delamination layer.

As shown in FIG. 6C, by separating the transferor substrate 60 from the transferee substrate 66, the circuit chip 36 is transferred to the desired position on the transferee substrate 66. Then, by forming an insulating film covering the circuit chip 36, etc., and additionally by forming a light-emitting element layer 16 on the second wiring layer 14, an organic EL display device 100 is formed.

A part of the delamination layer 62 may remain bonded on the circuit chip 36 transferred to the transferee substrate 66. It is preferable to remove the remaining delamination layer completely. The method for removing the remaining delamination layer 62 is appropriately selected from, for example, washing, etching, ashing, polishing or a combination thereof. Similarly, when a part of the delamination layer 62 remains on the surface of the transferor substrate 60 which already transferred the circuit chip 36, it is removed in a manner similar to the case of the transferee substrate 66 described above. By putting the transferor substrate 60 through this process, it can be used again. By thus recycling the transferor substrate 60, the production cost can be reduced. Particularly when the transferor substrate 60 is made of an expensive material, such as quartz glass or a rare material, the recycling of the substrate is effective in reducing the production cost.

As described above, in the present exemplary embodiment, the feed line film 32 constitutes an upper layer among the wiring films so as to be formed as late as possible. This prevents the feed line film 32 from having higher resistance due to the effect of the manufacturing process and thus the feed line film 32 with lower resistance is obtained. Consequently, the resistance of the feed line film in the organic EL display device can be reduced, and thereby the loss in the current supply to the organic EL element and the voltage required for driving the organic EL element can be reduced.

<Second Exemplary Embodiment>

In the above-described first exemplary embodiment, a circuit thin film is formed by transferably forming a circuit chip that includes the circuit thin film, separating the circuit chip from the transferor substrate 60, and transferring the circuit chip. However, the present invention is applicable to the case in which a circuit thin film is directly formed on a substrate which constitutes an end product together with a wiring film such as a feed line film without use of the above-described transfer technique. This is described in detail below.

Figure 8A:
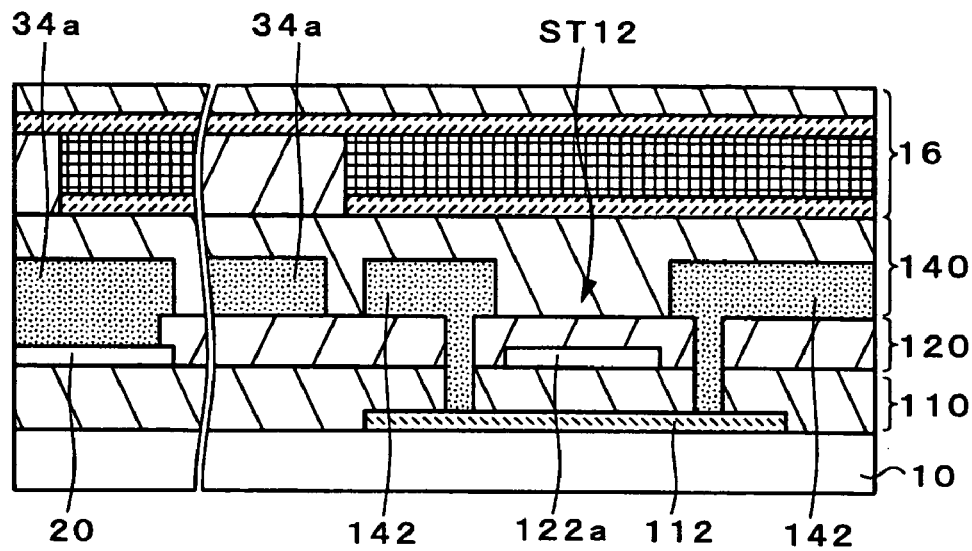
FIGS. 8A and 8B are schematics of an organic EL display device of the second exemplary embodiment.
Figure 8B:
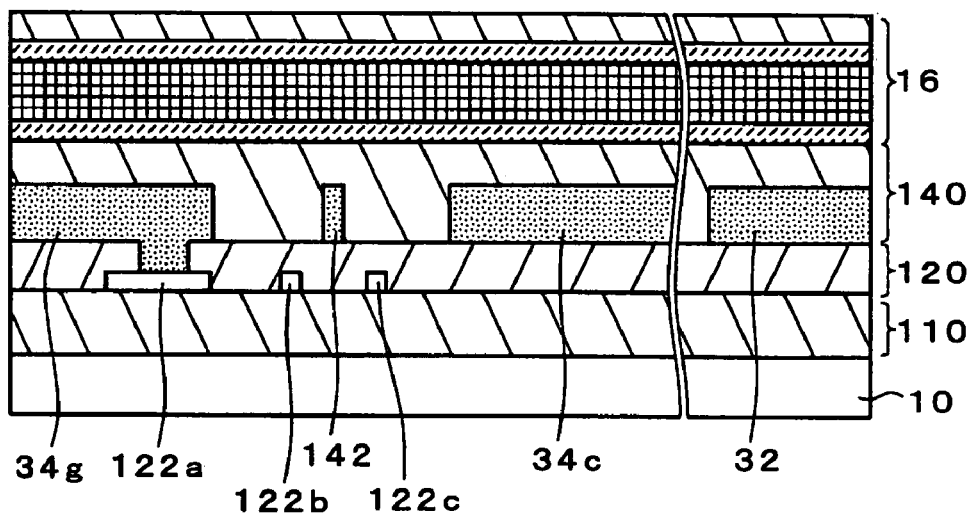

FIG. 7-FIG. 8B are schematics of an organic EL display device of the second exemplary embodiment. The basic structure of the pixel 101 of this exemplary embodiment is identical to the same of the first exemplary embodiment (see FIG. 2). However, this embodiment differs from the first exemplary embodiment in that a circuit thin film which contains driver circuit is formed directly without use of the transfer technique in the region where a circuit chip 36 is formed by the transfer technique in the first exemplary embodiment. FIG. 7 is an enlarged plan view showing a part of the pixel 101 including the region to form the circuit thin film. FIG. 8A and FIG. 8B are sectional views taken along plane C–C' and plane D–D' of FIG. 7, respectively. The elements identical to those described with reference to FIG. 2, etc., are designated with the same reference numerals, and the detailed description thereof is skipped.

As shown in FIG. 7, the circuit thin film 136 holding a driver circuit has basically the same structure and function as the circuit chip 36 of the above-described first exemplary embodiment. Namely, the circuit thin film 136 includes three switching TFTs ST11, ST12, and ST13 arranged vertically in the left region; and three driving TFTs DT11, DT12, and DT13 arranged horizontally in the right region. The circuit thin film 136 including these TFTs is connected with each of the wiring films 34a to 34j. This circuit thin film 136 is an example of the structure of one to be formed in the upper pixel 101 shown in FIG. 2. On the other hand, the circuit thin film 136 to be formed in the lower pixel 101 has a structure which corresponds to the inverted structure of the circuit thin film shown in the drawing.

As shown in FIGS. 8A and 8B the organic EL display device of the present exemplary embodiment is formed by laminating on a substrate 10, a semiconductor layer 110, a first wiring layer 120, a second wiring layer 140, and a light-emitting element layer 16, in that order starting from the bottom. In other words, the organic EL display device of the present exemplary embodiment is constructed by forming a light-emitting element layer 16 on a circuit board including a substrate 10, a semiconductor layer 110, a first wiring layer 120, and a second wiring layer 140.

As shown in FIG. 8A, the switching TFT ST12 includes a semiconductor film 112 that is formed of polycrystalline silicon film and that contains an active region (channel forming region), a gate electrode 122a that is integrally formed with a source/drain electrode 142, and a source/drain electrode 142 that is integrally formed with a source/drain line. Other switching TFT and driving TFT that are not shown have the same structure as the switching TFT ST12.

As shown in FIG. 8A and FIG. 8B, the gate lines (gate electrodes) 122a to 122c and other gate lines that are not shown are included in the same first wiring layer 120 as a signal line film 20, and these are formed in the same process. The source/drain line (source/drain electrode) 142 and other source/drain lines that are not shown are included in the same second wiring layer 140 as a feed line film 32, wirings 34a to 34j, and operation line film 30 (not shown partly), and these are formed in the same process. Namely, also in this example, each film is formed so that a feed line film 32 constitutes an upper layer among the circuit thin film 136, the feed line film 32, the signal line film 20, and the operation line film 30. Adopting such a structure enables the formation of the feed line film 32 as late as possible in the process forming the circuit board (circuit board forming process). In this way, increase in resistance of the feed line film 32 due to the effect of manufacturing process is minimized, and the feed line film 32 with lower resistance is obtained.

The circuit thin film 136 includes TFT and needs a comparatively high temperature process. However, since the feed line film 32 is formed later than the circuit thin film 136, the feed line film 32 is prevented from being affected by the high temperature process, and the feed line film 32 with lower resistance can be obtained. Additionally, in this example, the forming process of organic EL element layer 16 (electro-optical element forming process) which is performed after the circuit board forming process is a comparatively low temperature process. Therefore, even if the forming process of organic EL element layer 16 is performed after the forming of the feed line film 32, the feed line film 32 is not affected by the process, and increase in resistance of the feed line film 32 is not caused. Furthermore, in the above-described circuit board, the operation line film 30 and the gate line 122a that doubles as the gate electrode of each TFT are disposed in the same layer. Above the layer, the signal line film 30, the feed line film 32, and the source/drain line 142 that doubles as the source/drain electrode of each TFT. This simplifies the manufacturing process. Since the source/drain line 142 is formed in the same process as the feed line film 32, the source/drain line 142, through which comparatively large current flows, can have lower resistance.

<Third Exemplary Embodiment>

Various electronic devices including the organic EL display device of the above-described exemplary embodiments are described below according to a third exemplary embodiment.

Figure 9A:
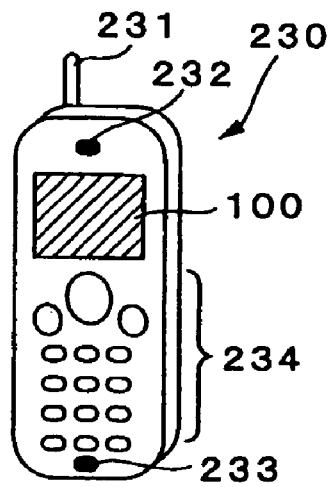
FIGS. 9A to 9D are schematics of concrete examples of electronic devices of the present exemplary embodiment.
Figure 9B:
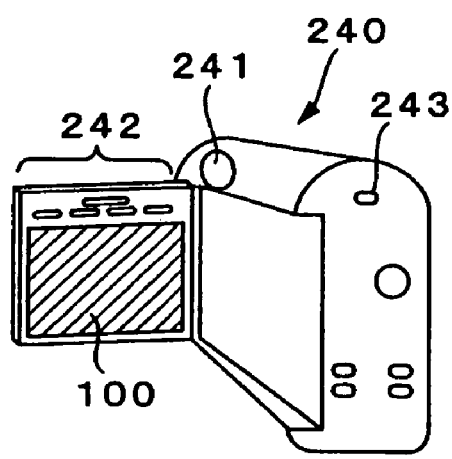

FIGS. 9A to 9D are schematics of exemplary electronic devices of the third exemplary embodiment. FIG. 9A is an exemplary embodiment of a cellular phone. The cellular phone 230 has an antenna 231, a voice output unit 232, a voice input unit 233, a control unit 234, and an organic EL display device 100 of the present invention. In this way, the display device of the present invention is usable as a display. FIG. 9B is an exemplary embodiment of a camcorder. The camcorder 240 has an image receiving unit 241, a control unit 242, a voice input unit 243, and an organic EL display device 100 of the present invention. In this way, the display device of the present invention is usable as a finder and a display.

Figure 9C:
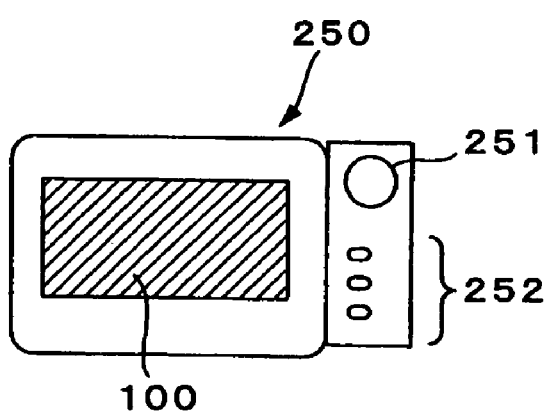
Figure 9D:
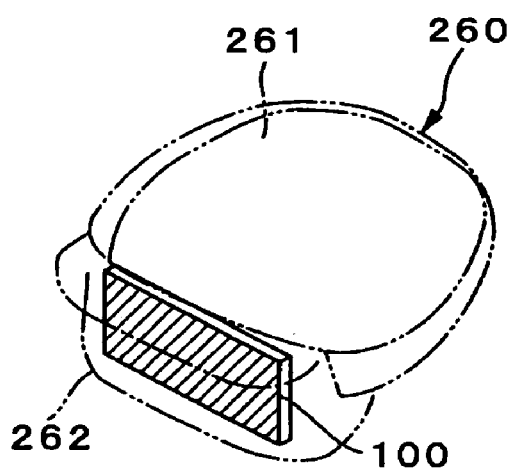

FIG. 9C is an exemplary embodiment of a portable personal computer. The portable personal computer 250 has a camera unit 251, a control unit 252, and an organic EL display device 100 of the present invention. In this way, the display device of the present invention is usable as a display. FIG. 9D is an exemplary embodiment of a head mounted display. The head mounted display 260 has a strap or band 261, an optical system housing 262, and an organic EL display device 100 of the present invention. In this way, the display device of the present invention is usable as an image display source. The display device of the present invention is not limited to the above-described exemplary embodiments and instead is applicable to various electronic devices, such as a fax machine, a digital camera, a portable television, and a personal digital assistant (PDA), for example.

<Exemplary Modifications of the Exemplary Embodiments>

The present invention is not intended to be limited to the above-described exemplary embodiments, and various modifications may be made without departing from the spirit of the present invention. For example, in the above-described exemplary embodiments, the operation line film 30 and the feed line film 32 are formed in the same layer. Alternatively, the signal line film 20 and the feed line film 32 may be disposed in the same layer, and the operation line film 30 may be formed below these layers. Each wiring film may be formed by laminating a signal line film 20, an operation line film 30, and a feed line film 32, in that order from the bottom, or by laminating an operation line film 30, a signal line film 20, and a feed line film 32 in that order from the bottom. Namely, in the present invention, as long as the feed line film 32 constitutes an upper layer among the wiring films, various forms including the above-described forms can be adopted.

In the above-described exemplary embodiments, the structure in which two vertically-adjacent pixels share the feed line films and elements are formed in reflection symmetry, is adopted. Such a structure can be adopted in connection with two horizontally-adjacent pixels.

Figure 10:
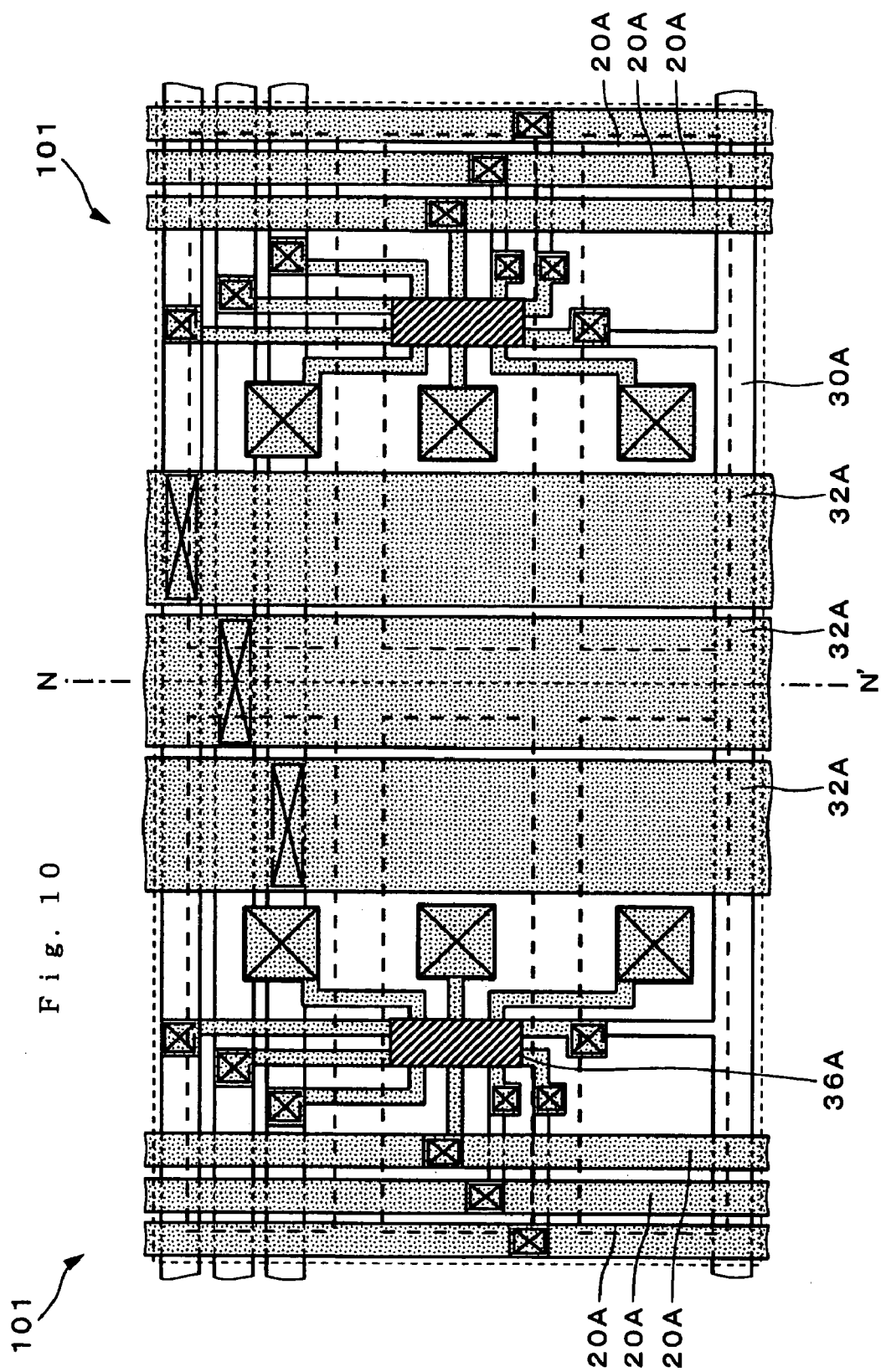
FIG. 10 is a schematic of an example of pixel structure in which feed line films are shared by two horizontally-adjacent pixels.
Figure 11:
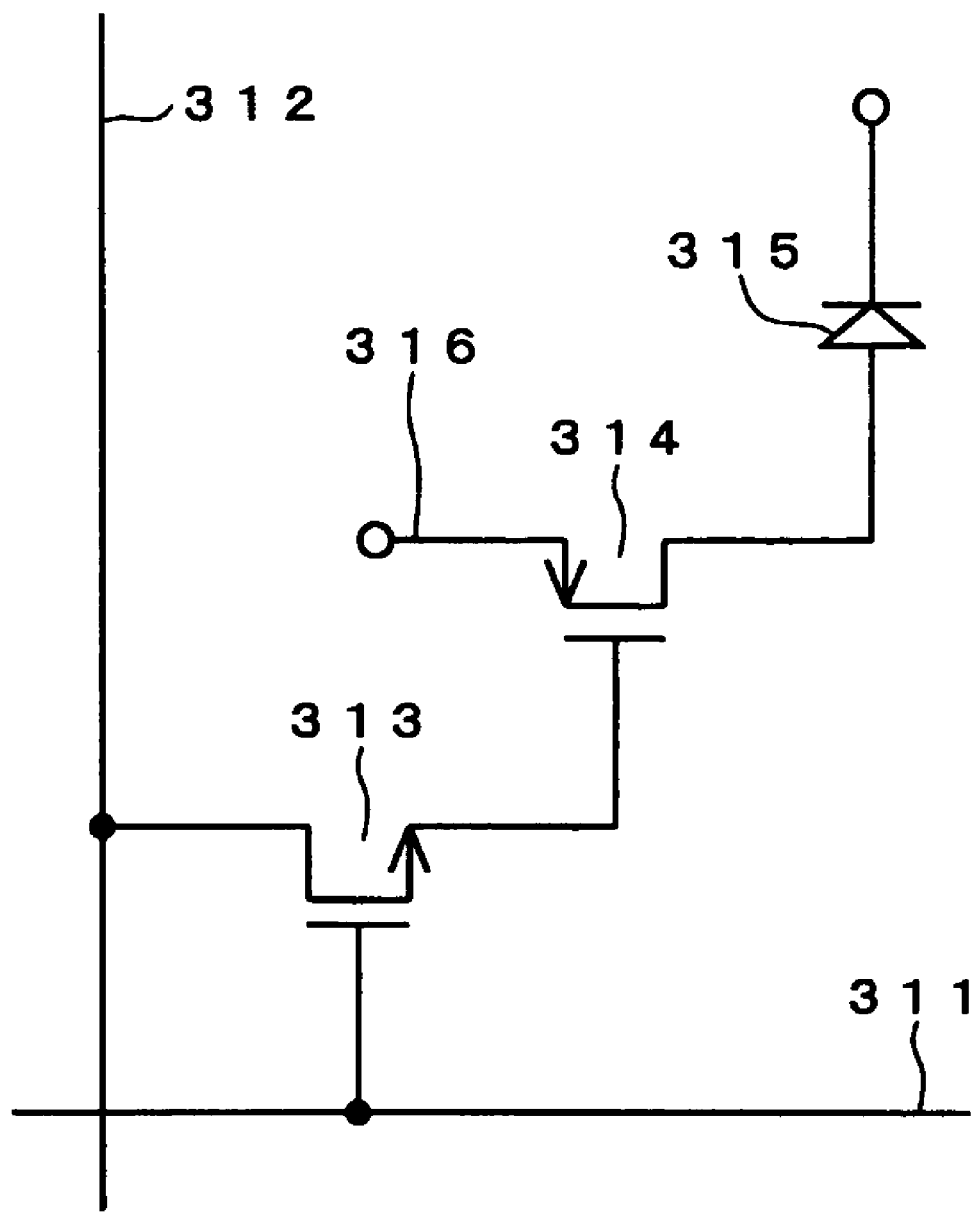
FIG. 11 is a schematic of a pixel circuit of a related art TFT-driving-mode light-emitting display device.

FIG. 10 is a schematic of an example of pixel structure in which feed line films are shared by two horizontally-adjacent pixels. Also in FIG. 10, some structural elements are omitted for illustrative convenience as in FIG. 2. In the pixel 101 shown in FIG. 10, an operation line film 30A is formed in the lower layer, and three signal line films 20A and three feed line films 32A are formed in the upper layer. The operation line film 30A supplies the circuit chip 36A with an operation instruction signal (scanning signal) to instruct whether to put the organic EL element into operation. The three signal line films 20A supply the circuit chip 36A with a level signal to determine intensity of current to be supplied to the organic EL element. Three feed line films 32A supply the circuit chip 36A with current to put the organic EL element into operation. The circuit chip 36A shown in FIG. 10 is formed by a transfer technique as in the first exemplary embodiment. Instead of the circuit chips 36A, a circuit thin film holding a driver circuit may be formed directly on the substrate.

The feed line film 32A shown in FIG. 10 is formed so as to be thicker than the operation line film 30A in the lower layer. Additionally, in the present example, the signal line film 20A is disposed in the same layer where the feed line film 32A is formed. This simplifies the manufacturing process and the signal line film 20A also has lower resistance. The feed line film 32A and the signal line film 20A are formed of a conductive film with lower resistance than the operation line film 30A. Specifically, they are formed of a conductive material such as aluminum, gold, silver, copper, platinum, and palladium. As shown in FIG. 10, the feed line film 32A, and the signal line film 20A extend substantially parallel to each other. The three feed line films 32A are shared by the two horizontally-adjacent columns of the pixels 101.

As shown in FIG. 10, the elements of each pixel 101 is formed substantially in reflection symmetry along the center line N–N', which is the boundary between the two horizontally-adjacent columns of the pixels 101. The signal line films 20A, which are disposed in the same layer as the feed line films 32A, are disposed in the vicinity of the left end and in the vicinity of the right end of the region for forming the two adjacent pixels 101, so as to make room in the middle of the region for disposing the three feed line films 32A. As described above, also when feed line films are shared by two horizontally-adjacent pixels, the same effect as in the case of the two vertically-adjacent pixels is achieved.

In the above-described exemplary embodiments, an organic EL display device is taken as an exemplary embodiment of electro-optical device. However, the present invention is not intended to be limited to this, and instead can be applied to electro-optical devices with other various electro-optical elements (for example, plasma emission elements, electrophoretic elements, and liquid crystal elements). The present invention is not intended to be limited to an electro-optical device and a method for manufacturing same. The present invention can be applied widely to various devices with substrates including a laminated wiring.

What is claimed is:

1. A wiring board used for an electro-optical device that includes an electro-optical element and a driver circuit to drive the electro-optical element, the wiring board comprising:
   a feed line film to supply the driver circuit with current to put the electro-optical element into operation;
   a signal line film to supply the driver circuit with a level signal to determine intensity of the current to be supplied to the electro-optical element; and
   an operation line film to supply the driver circuit with an operation instruction signal to instruct whether to put the electro-optical element into operation;
   the feed line film constituting an upper layer among the feed line film, the signal line film, and the operation line film.

2. The wiring board according to claim 1, the feed line film being thicker than at least one of the signal line film and the operation line film.

3. The wiring board according to claim 1, the feed line film being a conductive film having lower resistance than at least one of the signal line film and the operation line film.

4. The wiring board according to claim 1, the feed line film and the operation line film being disposed in the same layer.

5. The wiring board according to claim 1, the operation line film and the feed line film being formed to extend substantially parallel to each other.

6. An electro-optical device, comprising:
   the wiring board according to claim 1;
   an electro-optical element; and
   a driver circuit formed on the wiring board.

7. The electro-optical device according to claim 6, the driver circuit being a transferable circuit thin film formed on a transferor substrate different from the wiring board, and the driver circuit being separated from the transferor substrate and transferred to be connected electrically with each of the feed line film, the signal line film, and the operation line film of the wiring board.

8. An electronic device, comprising:
   the electro-optical device according to claim 6 usable as a display.

9. The wiring board used for an electro-optical device that includes a display region and a driver circuit, the display region including a plurality of basic pixels, each including at least one electro-optical element, the driver circuit driving each of the at least one electro-optical element, the wiring board comprising:
   a plurality of feed line films to supply the driver circuit with current to put the electro-optical element into operation;
   a plurality of signal line films to supply the driver circuit with a level signal to determine intensity of the current to be supplied to the electro-optical element; and
   a plurality of operation line films to supply the driver circuit with an operation instruction signal to instruct whether to put the electro-optical element into operation;
   the feed line films constituting an upper layer among the feed line films, the signal line films, and the operation line films; and
   the plurality of feed line films being disposed along the array of the basic pixels, and at least one feed line film being shared by two adjacent columns of the basic pixels.

10. The wiring board according to claim 9, each of the basic pixels including three electro-optical elements, and the feed line films being disposed so that three of the plurality of feed line films are shared by two adjacent columns of the basic pixels.

11. The wiring board according to claim 9, the feed line films, the operation line films, and the signal line films being arranged in reflection symmetry along the center line that is the boundary between two adjacent columns of the basic pixels.

12. A circuit board used for an electro-optical device that includes an electro-optical element and a driver circuit to drive the electro-optical element, the circuit board comprising:
   a circuit thin film holding the driver circuit;
   a feed line film to supply the driver circuit with current to put the electro-optical element into operation;
   a signal line film to supply the driver circuit with a level signal to determine intensity of the current to be supplied to the electro-optical element; and
   an operation line film to supply the driver circuit with an operation instruction signal to instruct whether to put the electro-optical element into operation;
   the feed line film constituting an upper layer among the circuit thin film, the feed line film, the signal line film, and the operation line film.

13. The circuit board according to claim 12, the driver circuit including a plurality of thin film transistors, one of the signal line film and the operation line film and gate lines of the thin film transistors being disposed in the same layer, and the other of the signal line film and the operation line film and source/drain lines of the thin film transistors being disposed above the layer.

14. An electro-optical device, comprising:
   the circuit board according to claim 12; and
   an electro-optical element formed on the circuit board.

15. A method for manufacturing an electro-optical device that includes a display region and a driver circuit, the display region including a plurality of basic pixels, each including at least one electro-optical element, the driver circuit driving each of the electro-optical element, the method comprising:
   forming a laminated wiring that includes a feed line film to supply the driver circuit with current to put the electro-optical element into operation, a signal line film to supply the driver circuit with a level signal to determine intensity of the current to be supplied to the electro-optical element, and an operation line film to supply the driver circuit with an operation instruction signal to instruct whether to put the electro-optical element into operation, on a first substrate according to the array of the basic pixels;
   transferably forming a circuit thin film holding the driver circuit on a second substrate; and
   transferring the circuit thin film from the second substrate to each region corresponding to the basic pixels on the first substrate, and connecting the circuit thin film with the laminated wiring;
   the forming including forming the laminated wiring so that the feed line film constitutes an upper layer among the feed line film, the signal line film, and the operation line film.

16. The method for manufacturing an electro-optical device according to claim 15, the transferably forming including forming a delamination layer locating between the second substrate and the circuit thin film and having properties causing a change in state by the application of energy and reducing bonding strength with the circuit thin film.

17. A method for manufacturing an electro-optical device that includes an electro-optical element and a driver circuit to drive the electro-optical element, the method comprising:

forming, on a substrate, a circuit thin film holding the driver circuit, a feed line film to supply the driver circuit with current to put the electro-optical element into operation, a signal line film to supply the driver circuit with a level signal to determine intensity of the current to be supplied to the electro-optical element, and an operation line film to supply the driver circuit with an operation instruction signal to instruct whether to put the electro-optical element into operation; and forming the electro-optical element on the substrate on which the circuit thin film, the feed line film, the signal line film, and the operation line film are formed;

the forming the circuit thin film including forming each film so that the feed line film constitutes an upper layer among the circuit thin film, the feed line film, the signal line film, and the operation line film.

18. The method for manufacturing an electro-optical device according to claim 17, the driver circuit including a thin film transistor, one of the signal line film and the operation line film and a gate line of the thin film transistor being disposed in the same layer, and the other of the signal line film and the operation line film and a source/drain line of the thin film transistor being disposed above the layer.

* * * * *